United States Patent [19]

Wang et al.

[11] Patent Number: 5,223,834
[45] Date of Patent: Jun. 29, 1993

[54] TIMING CONTROL FOR PRECHARGED CIRCUIT

[75] Inventors: Yunn-Hwa Wang; Yung-Peng Hwung, both of Taipei; Tien-Yu Wu, Hsinchu, all of Taiwan

[73] Assignee: Industrial Technology Research Institute, Hsinchu, Taiwan

[21] Appl. No.: 800,008

[22] Filed: Nov. 29, 1991

[51] Int. Cl.[5] ............................................. H03M 1/12
[52] U.S. Cl. .................................... 341/136; 341/155; 307/448
[58] Field of Search ................ 341/136, 155; 307/448, 307/592, 594

[56] References Cited

U.S. PATENT DOCUMENTS

| | | | |
|---|---|---|---|
| 4,250,494 | 2/1981 | Butler et al. | 341/136 |
| 4,633,107 | 12/1986 | Norsworthy | 307/592 |
| 4,857,764 | 8/1989 | Young | 307/448 |
| 4,883,989 | 11/1989 | Mizukami | 307/448 |

Primary Examiner—Marc Hoff
Attorney, Agent, or Firm—H. C. Lin

[57] ABSTRACT

A timing control for precharged digital circuits to avoid spurious error appearing at the output due to the slow pull-down of the precharged node after precharging. A NAND gate is used to delay the precharged node siganl transmitting to the output stage until the precharged node is fully discharged. This timing control circuit is used to prevent any spurious peaking of the output of an analog-to-digital converter using precharged bit lines.

4 Claims, 6 Drawing Sheets

TIMING CONTROL FOR PRECHARGED CIRCUIT

BACKGROUND

Precharge type circuits are widely used in digital systems, such as dynamic logic circuits, shift registers, analog-to-digital converters, etc., to speed up the operation. In a precharge type logic circuit, there are two phases of operation. In the first phase, the load device of a driver is turned on by a clock pulse, which charges up the output node of the driver. In the second phase, a binary signal is applied to the driver to turn on or cut off the driver. If the driver is turned on, the precharged node is discharged and pulled down. Since the discharging (or pulling-down) time through the on resistance of the driver is usually shorter than the charging up (or pulling-up) time of the output node through a static load resistance, such a precharge type circuit is widely used to speed up the operation of many digital systems.

Bit line sense circuits are mainly used in the encoder and the output buffer of many analog-to-digital (A/D) converters to obtain accurate control of the timing and to speed up the output. In conventional A/D circuits, the digital data from the comparators are decoded and then encoded into binary or gray codes. However, when the encoders are of the precharge type, the digital code may arrive at the output buffer too soon or too late. If too soon, the output may produce false peaks. If too late, the conversion speed may be slowed down. In either case, the invalid time of the A/D converter output is adversely increased. In traditional A/D converters, the flash type is the fastest. Due to the limitations of resolution, power dissipation, chip size, etc., the present-day design can only achieve about 8 bits. FIG. 1 shows the simplified organization of a conventional A/D converter. The structure basically contains a voltage divider with $2^M$ sections of resistors to produce reference voltages for $2^M-1$ or $2^M$ comparators. One input terminal of each comparator is connected to a reference voltage and another input terminal is connected to the analog input signal. The comparators produce a thermometer code. The thermometer code is decoded into X-code for application to an encoder or ROM. The encoder then produce the desired y-bits of binary code or gray code. The code is delivered to the output through an output buffer.

When CMOS technology is used to implement A/D conversion, auto-zero type comparators and three-input decoders are customarily used to change the thermometer code into a logic "1" level at only one of the X-code. The outputs from the decoder are fed to the row or word lines of a following encoder. The encoder is organized in the form of a ROM. The block diagram is shown in FIG. 2. The encoder section is placed after the decoder. The column or bit lines of the encoder are connected to the drains of a number of parallel MOS transistors, individually controlled by the different word lines.

Traditionally, there are two kinds of encoders:

(1) Ratio Logic type coding:—The advantages of this type of circuit lies in its simplicity. However, since this type of logic is a static one, the power dissipation is high and the speed is slow. Furthermore, since this type is a ratio logic, the threshold voltage, hence the process, is critical.

(2) Precharge type coding:—The bit line of this type of encoder is a dynamic logic device. During the comparing time of the comparator, the bit lines of the encoder are precharged to either a high voltage or a low voltage. During the auto-zero time of the comparator to correct any mismatch of the input differential transistors, the charge on the bit lines which a particular word line controls is discharged by the only logic "1" signal from the decoder. However, the timing control of this type of encoder is very sensitive in that false peaking may appear at the output and the invalid time may increase.

FIG. 3 shows a typical precharge type circuit between the encoder and the output buffer of a conventional ADC. 110 is the precharge device for precharging the bit line 15 and controlled by a clock CK3 at input 16. The bit line 15 is connected to $2^{M-1}$ MOS transistors (MOSFET). Since only one word line has a logic "1" signal appearing at line 14, all the rest of the MOSFETs with their gates connected to other word lines are at a "0" logic level or ground, as represented by the grounded gate MOSFET symbol 112. The signal at node 15 are then transmitted through a NAND gate to the output buffer 10. The NAND gate has two p-channel MOSFETs connected in series with two n-channel MOSFETs. The signal form the precharged node is fed through an inverter to the common gate of one pair of complementary gates. The other gate 20 of the p-channel MOSFET 115 and the gate 21 of the n-channel MOSFET 114 are clocked to turn on MOSFETs 114, 115 when the clock signal CK3 is off. Then, the precharged signal appears at the output 19 of the NAND gate.

The output buffer is a latch with a complementary MOSFET transmission gate with n-channel MOSFET 117 and p-channel MOSFET 118 connecting the output 25 back to the input 19. MOSFETs 117 and 118 are also controlled by the signals at 20 and 21 to latch the output signal 25 after the clock signal CK3 is off.

Such a conventional organization has experienced problems in operation. The situation is as follows: During the comparing period of the comparator, MOSFETs 115, 114 are off, input 16 is low to turn the p-channel MOSFET 110 on and to charge the bit line 15 high. Latch 10 is latched to previous data. Next, during the auto-zero period of the comparators, both MOSFETs 114, 115 are on. When bit line 15 data "0" is to be transferred to the output buffer, error peak signals may appear. Consider the following situations:

(1) Word line 14 is low, output node 25 is initially low: Since node 15 is high and causes the output 25 to be high, there is no change in the output, and hence no error peaking signal at the output.

(2) When node 14 is low and node 25 is initially low: Since node 15 is initially high and the word line node 14 remains low, node 15 stays high. When MOSFETs 115, 114 are turned on, the output 25 changes from low to high and is stable without any error peaking signal.

(3) When node 14 is high, and node 25 is initially high: Since node 15 is initially high, the output continues to be high when MOSFETs 114 and 115 are on. Only when bit line 15 is pulled down by the high signal at node 14, then output 25 becomes low. Thus, the output 25 changes from high to low, and is stable without any error peaking.

(4) When node 14 is high and node 25 is initially low: When node 14 is high, the precharged node 15 is pulled from high to low. This pull-down action may take considerable amount of time to complete. If before node 15 becomes low, the MOSFETs 114, 115 are turned on, the output 25 may become high before falling back to low. Thus, an error peaking signal appears at the output.

The output waveform of this last situation is shown in FIG. 4. In this figure, V15 indicates the voltage at node 15. V25 indicates the voltage at node 25. Do is the output waveform of the output buffer.

SUMMARY

The object of this invention is to eliminate any errors at the output of a dynamic precharged type digital circuit. Another object of this invention is to provide an exact timing control for the bit line of an ADC to switch on the output buffer, thereby eliminating any output error. Still another object of this invention is to reduce the invalid time of an ADC, thus speeding up the operation of the ADC. A further object of this invention is to speed up the operation of an ADC using dynamic encoders.

These objects are achieved in this invention by introducing a time delay for the transfer of signals between the precharged encoder and the output buffer. An (N+1) input NAND gate, with N bit lines and one word line, is used to produce the delay and accurate timing signal for turning on a switch between the encoder and the output buffer.

DESCRIPTION OF THE PREFERRED EMBODIMENT

Figure 1:
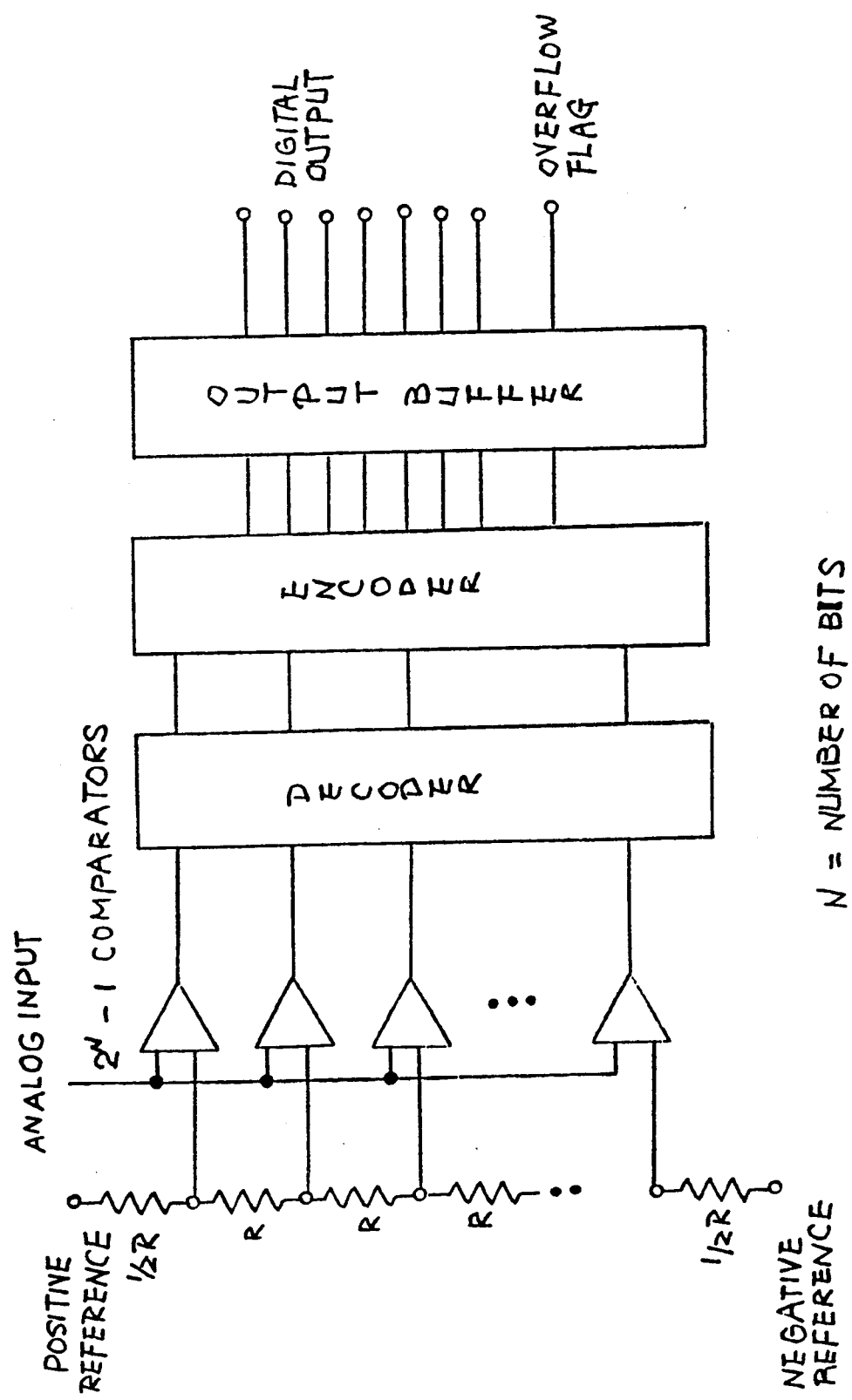
FIG. 1 shows the oarganization of a conventional flash ADC.
Figure 2:
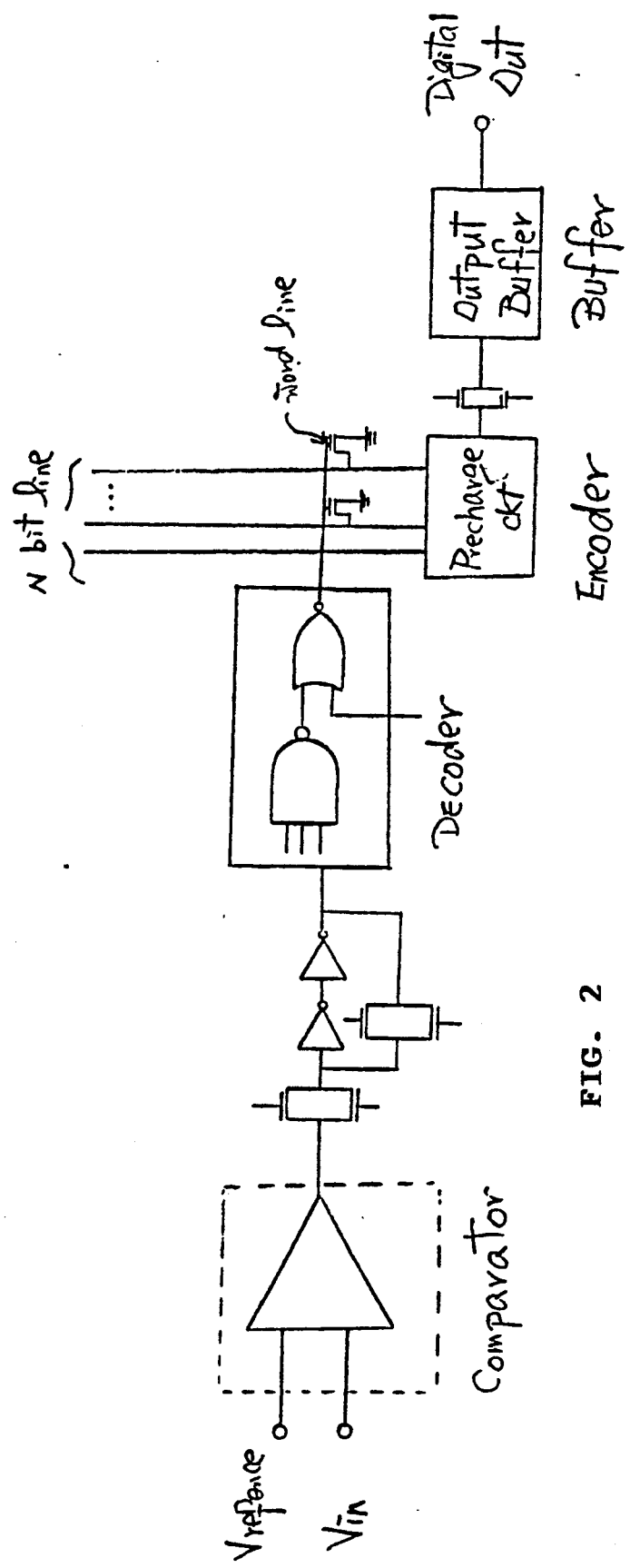
FIG. 2 shows the block diagram of a conventional flash ADC.
Figure 3:
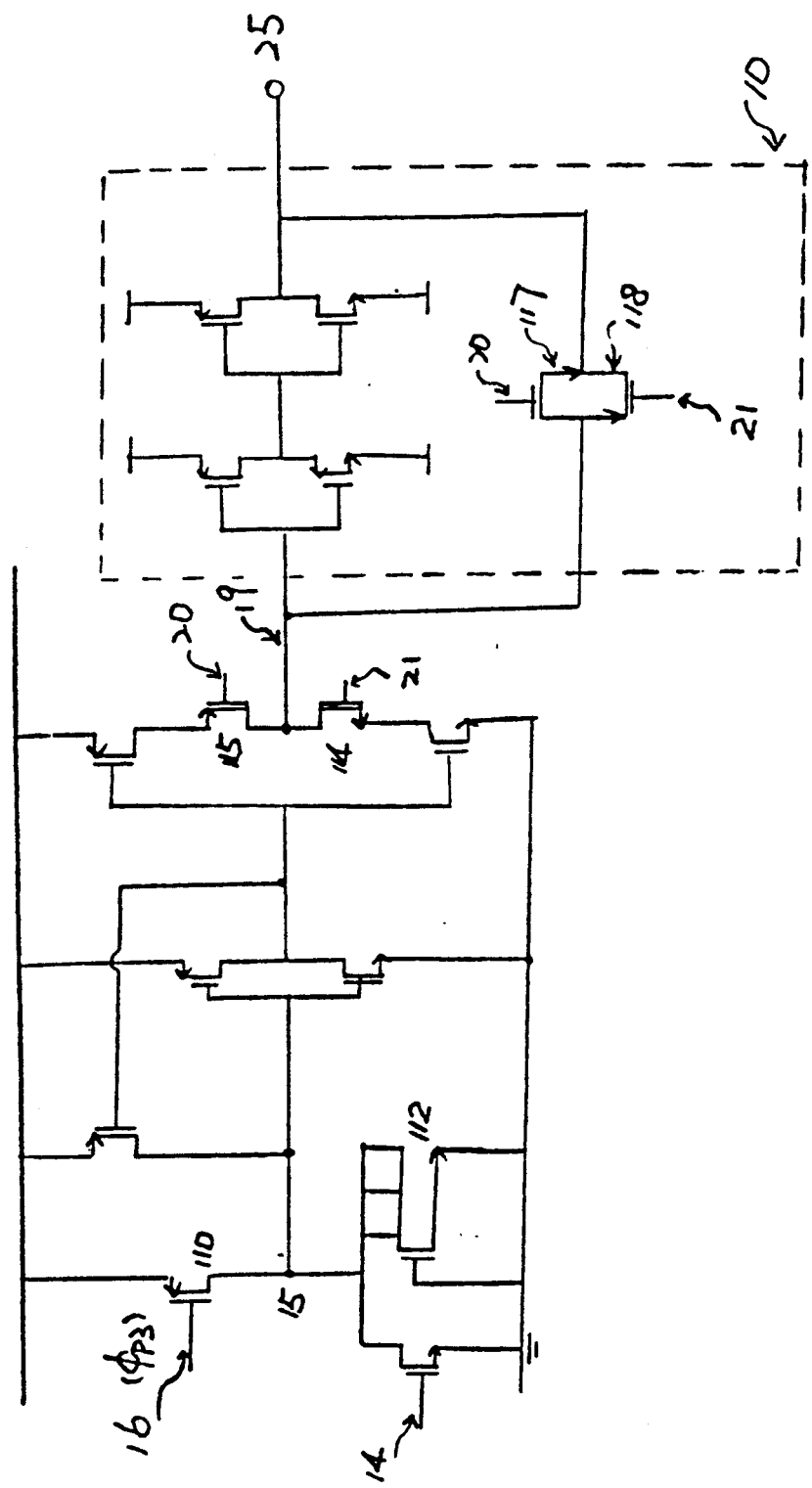
FIG. 3 shows the circuit diagram between the encoder and the output buffer of an ADC.
Figure 5:
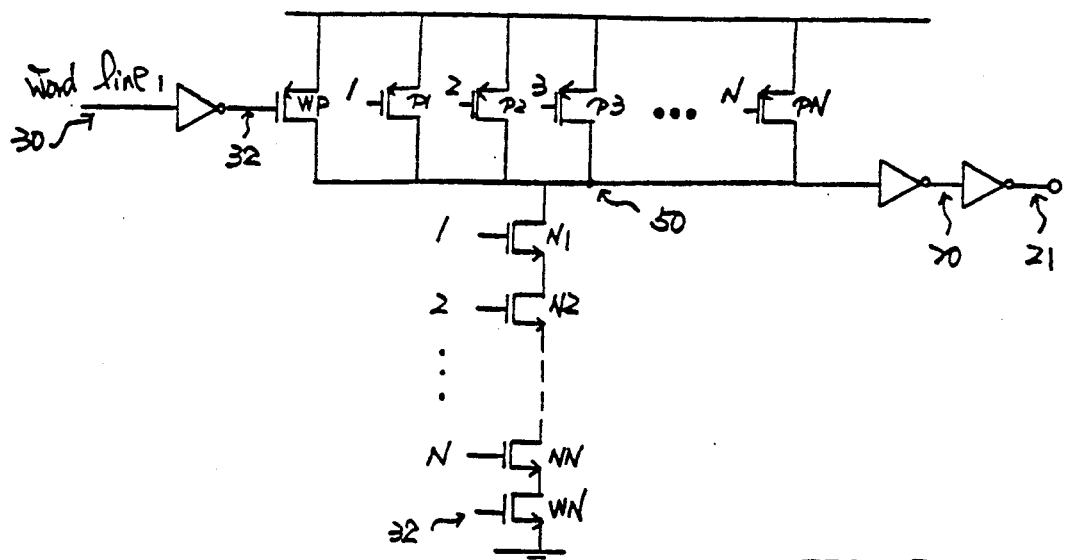
FIG. 5 shows the control circuit of this invention using an (N+1) input NAND gate.

The control circuit for this invention is shown in FIG. 5. In this invention, a control circuit is used to switch on MOSFETs 114, 115 to avoid the error for the above-mentioned condition (4). In FIG. 5, the N columns of bit lines, 1,2, . . . ,N, are connected to a (N+1) input NAND gate. An additonal input is connected to the complement 32 of word line 30. During the precharging period, all the bit lines are charged to a high voltage and the word line such as 30 is low. Under this condition, the NAND gate output 50 is low and the signals at the two following inverters turn off the MOSFETs 114 and 115 in FIG. 3. Thus, the signal at the precharged node cannot propagate to the output. When the decoder generates a "1" signal at the word line 30, the p-channel MOSFET Wp is turned on and the node 50 goes high. The output of the NAND 50 is connected to two inverters to derive two delayed NAND ouput signals 20 and 21. These delayed signals are used to control the inverter consisting of the MOSFETs 115 and 116 in FIG. 3. Because of this delay, when any one of the bit lines goes low, the delay of outputs 20 and 21 delays the turning on of the corresponding inverter until the bit line 15 reaches its final low value. Thus the output 25 in FIG. 3, remains low during the transient period and no errors are introduced.

If the NAND gate had only N inputs instead of (N+1) inputs, then the output 20 can be high and output 21 can be low to turn off MOSFETs 114 and 115 when all the bit lines are high. Then the A/D converter output remains at the previous state and error is introduced, because the word line signal should logically result in a different output. This invention adds another input 32 with an inverted word line signal to eliminate the error.

In FIG. 5, there are 1 through N bit line outputs. The word line input 30 is inverted to have a complementary output 32. P1, . . . , PN, WP are all p-channel MOSFETs (p-MOS) with gates connected to the bit lines 1 through N. The sources of these p-MOS are all connected to the positive terminal of a power supply. The drains of these p-MOS are connected to node 50. N1, . . . NN, WN are n-channel MOSFETs (n-MOS) and are connected in series between node 50 and the negative terminal of the power supply. The gates of these n-MOS are each connected to the bit lines 1 through N. The gates of WN and WP are connected to node 32. This arrangement constitutes a NAND gate with (N+1) n-MOS. Such a long series connection of MOSFETs results in high series resistance, which introduces long delay of this NAND.

Figure 6:
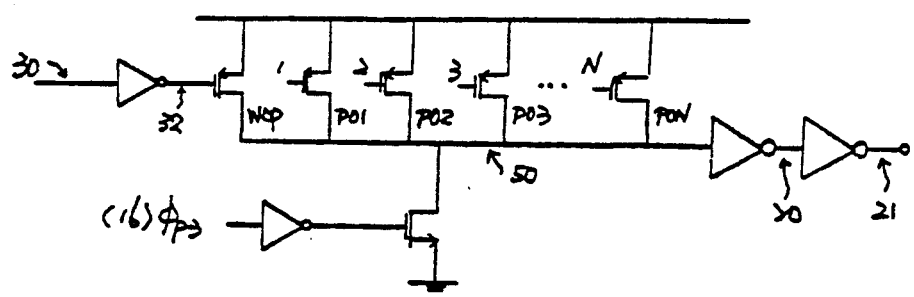
FIG. 6 shows another control circuit of this invention using a dynamic NAND gate.

This shortcoming can be improved by the dynamic NAND gate circuit shown in FIG. 6. In this circuit, the p-MOS Po1, Po2, . . . , PoN are connected in parallel in the same manner as in FIG. 5. However, the N-MOS is now reduced from (N+1) MOSFETs to only one MOSFET Won, the gate of which is controlled by the complement of the precharging clock CK3 at node 16 in FIG. 3. Thus the n-MOS Won is turned on when the precharging clock is turned off. Since only one n-MOS is used, the resistance is low and the delay is reduced.

Figure 4:
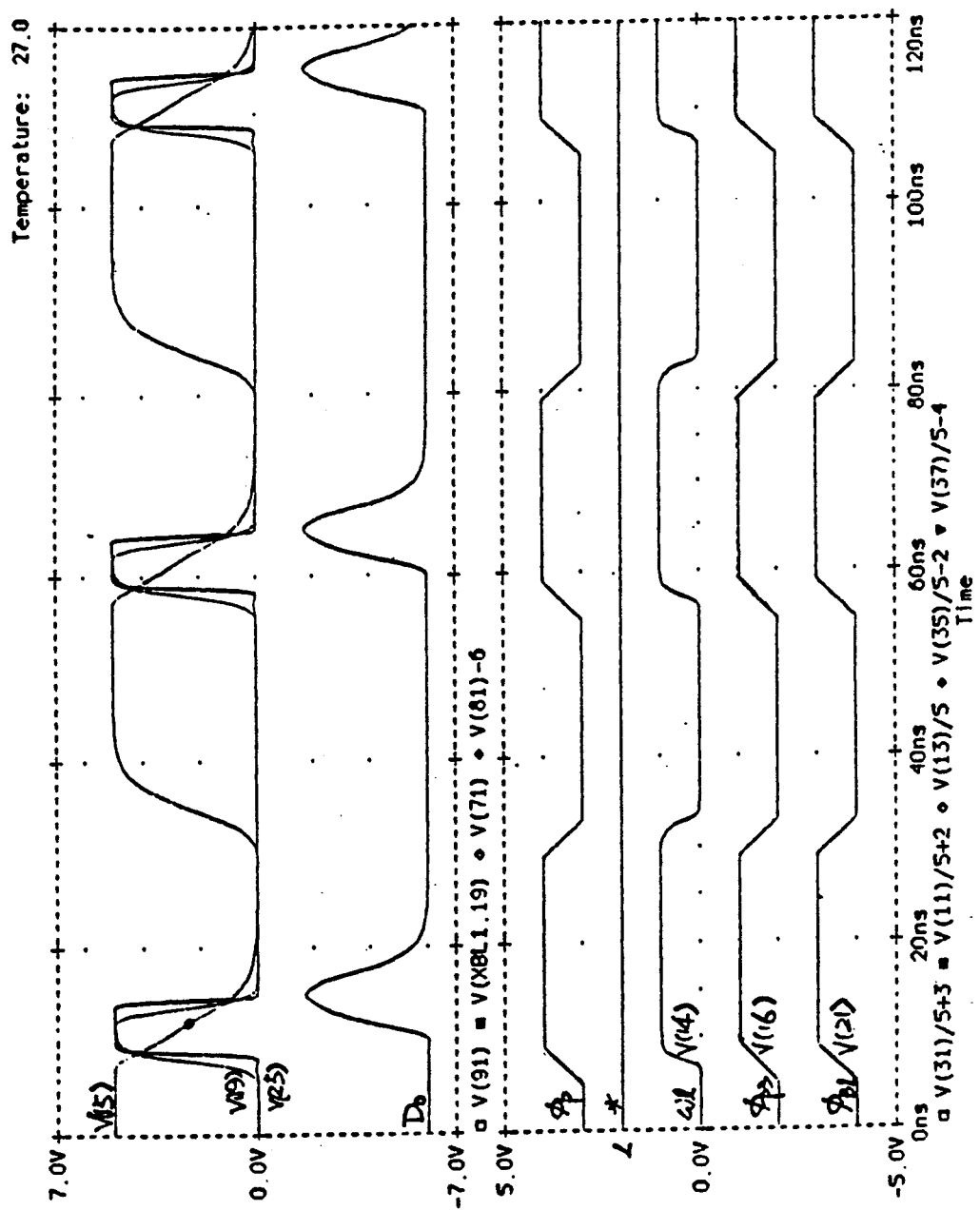
FIG. 4 shows the output waveform of a precharge-type encoder of a conventional ADC.
Figure 7:
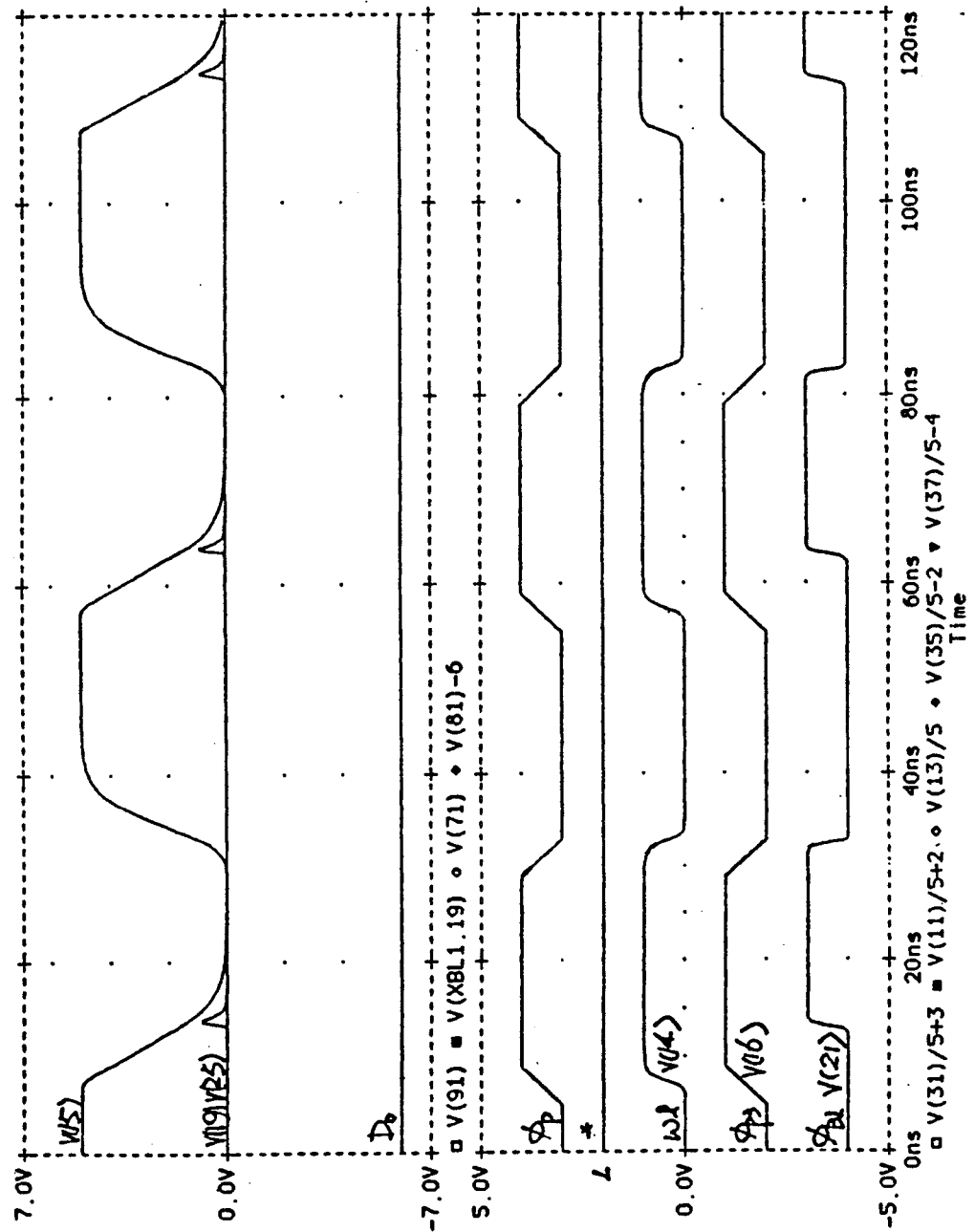
FIG. 7 shows the output waveforms using the control circuit shown in FIG. 6.

The simulation result of this dynamic NAND is shown in FIG. 7. It can be seen that the waveform of the output V25 has only a very small disturbance, and the output of the output buffer does not have any spurious peak as that shown in FIG. 4. Note also that Do in FIG. 4 needs 20 ns to become stable, while Do in FIG. 7 requires only 14 ns to reach a correct output. Thus, the ADC circuit of this invention can improve the speed of operation.

While the foregoing description applies to an ADC, the same technique can also be used in other precharged type circuits.

What is claimed is:

1. An analog-to-digital converter with a comparator, an auto-zero circuit, a decoder, an encoder, an output buffer in cascade, and having a precharging phase and signal transmission phase, comprising:

a precharging section, an output section, and a transmission section connected between said precharging section and said output section, said precharging section comprising:

a MOSFET driver having a precharged node connected to a precharging MOSFET load device having a gate driven from a clock pulse, said MOSFET load device being turned on during said precharging phase to charge said precharged node to a high logic level, said encoder serving as said precharging section arranged like a ROM having bit lines and word lines, each said bit line serving as one said precharged node, one of said word lines having signal "1" derived from said decoder;

an input signal applied to the gate of said driver MOSFET for controlling said driver to be on or off during said signal transmission phase, and pulling down said precharged node if said driver is on;

said output buffer serving as said said output section;

a delay circuit comprising a MOSFET NAND gate having said input signal AND said precharged node voltage as inputs for controlling the timing of transmission of said transmission section until said precharged node has reached a final logical level, a N+1 input NAND gate having as inputs one word line signal and N bit line signals and driving two inverters serving as said delay circuit;

said transmission section having a two input MOSFET logic gate controlled by output of two said inverters.

2. A dynamic digital system as described in claim 1, wherein said N+1 input NAND gate is a static complementary MOSFET gate.

3. A dynamic digital system as described in claim 1, wherein said N+1 input NAND gate is dynamic logic gate, said dynamic NAND gate having N+1 p-channel MOSFETs connected in parallel between a positive power supply and a common node, an n-channel MOSFET connected between said common node and a negative power supply and controlled by complement of said clock.

4. A dynamic digital system as described in claim 1, wherein said output buffer is a latch.

* * * * *